(12) United States Patent
Badcock et al.

(10) Patent No.: US 11,830,925 B2
(45) Date of Patent: Nov. 28, 2023

(54) GRAPHENE TRANSISTOR AND METHOD OF MANUFACTURING A GRAPHENE TRANSISTOR

(71) Applicant: PARAGRAF LIMITED, Somersham (GB)

(72) Inventors: Thomas James Badcock, Somersham (GB); Robert Wallis, Somersham (GB); Ivor Guiney, Somersham (GB); Simon Thomas, Somersham (GB)

(73) Assignee: Paragraf Limited, Somersham (GB)

( * ) Notice: Subject to any disclaimer, the term of this patent is extended or adjusted under 35 U.S.C. 154(b) by 0 days.

(21) Appl. No.: 17/478,290

(22) Filed: Sep. 17, 2021

(65) Prior Publication Data

US 2022/0102526 A1    Mar. 31, 2022

(30) Foreign Application Priority Data

Sep. 28, 2020  (GB) ...................................... 2015321
Nov. 3, 2020   (GB) ...................................... 2017408

(51) Int. Cl.
  *H01L 29/66* (2006.01)
  *H01L 21/04* (2006.01)
  (Continued)

(52) U.S. Cl.
  CPC ...... *H01L 29/66045* (2013.01); *H01L 21/042* (2013.01); *H01L 29/1606* (2013.01); *H01L 29/7606* (2013.01); *H01L 29/7839* (2013.01)

(58) Field of Classification Search
  CPC ........... H01L 29/1606; H01L 29/66015; H01L 2924/13088; H01L 2224/05193;
  (Continued)

(56) References Cited

U.S. PATENT DOCUMENTS 10,593,546 B2   3/2020  Thomas
2010/0052093 A1* 3/2010 Hisatomi ............ H01L 21/3226
                                                257/506
(Continued)

FOREIGN PATENT DOCUMENTS

CN   102157548 A   8/2011
CN   106952949 A   7/2017
WO   2019/138231 A1   7/2019

OTHER PUBLICATIONS

European Search Report and Written Opinion, Application No. 21197623.8, dated Jan. 27, 2022, 8 pages.

*Primary Examiner* — Moin M Rahman
(74) *Attorney, Agent, or Firm* — Stinson LLP

(57) ABSTRACT

The present invention provides a method of manufacturing a graphene transistor 101, the method comprising: (a) providing a substrate having a substantially flat surface, wherein the surface comprises an insulating region 110 and an adjacent semiconducting region 105; (b) forming a graphene layer structure 115 on the surface, wherein the graphene layer structure is disposed on and across a portion of both the insulating region and the adjacent semiconducting region; (c) forming a layer of dielectric material 120 on a portion of the graphene layer structure which is itself disposed on the semiconducting region 105; and (d) providing: a source contact 125 on a portion of the graphene layer structure which is itself disposed on the insulating region 110; a gate contact 130 on the layer of dielectric material 120 and above a portion of the graphene layer structure which is itself disposed on the semiconducting region 105; and a drain contact 135 on the semiconducting region 105 of the substrate surface.

16 Claims, 2 Drawing Sheets

(51) Int. Cl.
*H01L 29/78* (2006.01)
*H01L 29/16* (2006.01)
*H01L 29/76* (2006.01)

(58) Field of Classification Search
CPC . H01L 2224/05293; H01L 2224/05393; H01L 2224/05493; H01L 2224/05693; H01L 2224/05793; H01L 2224/05893; H01L 2224/05993; H01L 2224/13193; H01L 2224/13293; H01L 224/13393; H01L 2224/13493; H01L 2224/13693; H01L 2224/13793; H01L 2224/13893; H01L 2224/13993; H01L 2224/29193; H01L 2224/29293; H01L 29/66045; H01L 21/042; H01L 29/7606; H01L 29/7839; H01L 29/0653; H01L 29/78; H01L 2224/29493; H01L 2224/29693; H01L 2224/29793; H01L 2224/29893; H01L 2224/29993; H01L 2224/37193; H01L 2224/37293; H01L 2224/37393; H01L 2224/37493; H01L 2224/37693; H01L 2224/37793; H01L 2224/37893; H01L 2224/37993; H01L 2224/45193; H01L 2224/45293; H01L 21/02376; C01B 32/182–198; C01B 2204/00–32; C01B 2204/02; C01B 2204/04; C01B 2204/06; C01B 2204/065; Y10S 977/734–753
See application file for complete search history.

(56) References Cited

U.S. PATENT DOCUMENTS

| | | | | |
|---|---|---|---|---|
| 2012/0056161 | A1* | 3/2012 | Avouris | H01L 29/778 257/E29.241 |
| 2012/0181509 | A1* | 7/2012 | Liang | H01L 29/78618 257/29 |
| 2015/0137074 | A1* | 5/2015 | Lee | H01L 29/1606 257/27 |
| 2015/0270350 | A1* | 9/2015 | Lagally | H01L 21/185 438/455 |
| 2016/0064489 | A1* | 3/2016 | Zhang | H01L 29/165 438/479 |
| 2016/0111180 | A1* | 4/2016 | Joo | H01L 29/66742 73/31.06 |
| 2018/0012962 | A1 | 1/2018 | Yeh et al. | |
| 2019/0035907 | A1 | 1/2019 | Boutchich et al. | |
| 2019/0165118 | A1* | 5/2019 | Leobandung | B82Y 10/00 |
| 2020/0350443 | A1* | 11/2020 | Lee | H01L 31/1136 |

* cited by examiner

GRAPHENE TRANSISTOR AND METHOD OF MANUFACTURING A GRAPHENE TRANSISTOR

REFERENCE TO RELATED APPLICATIONS

The present application claims the benefit of United Kingdom Application Nos. 2015321.9, filed Sep. 28, 2020, and 2017408.2 filed Nov. 3, 2020, the entire contents of which are incorporated herein by reference.

FIELD OF THE INVENTION

The present invention relates to a method of manufacturing a graphene transistor. In particular, the method of the invention provides a novel and improved approach for manufacturing a graphene transistor wherein the graphene is deposited across a substantially flat surface of a substrate having an insulating region and a semiconducting region. The provision of a substantially flat graphene layer allows for improved electronic properties which enable enhanced transistor performance. Moreover, the present invention relates to a graphene transistor comprising a substantially flat graphene layer disposed across both a portion of an insulating region, and a portion of a semiconducting region, of a substantially flat substrate.

BACKGROUND

Graphene is a well-known material with a plethora of proposed applications driven by the material's theoretical extraordinary properties. Good examples of such properties and applications are detailed in 'The Rise of Graphene' by A. K. Geim and K. S. Novoselev, Nature Materials, Volume 6, 183-191, March 2007 and in the focus issue of Nature Nanotechnology, Volume 9, Issue 10, October 2014.

WO 2017/029470, the content of which is incorporated herein by reference, discloses methods for producing two-dimensional materials. Specifically, WO 2017/029470 discloses a method of producing two-dimensional materials such as graphene, comprising heating a substrate held within a reaction chamber to a temperature that is within a decomposition range of a precursor, and that allows graphene formation from a species released from the decomposed precursor; establishing a steep temperature gradient that extends away from the substrate surface towards an inlet for the precursor; and introducing precursor through the relatively cool inlet and across the temperature gradient towards the substrate surface. The method of WO 2017/029470 may be performed using vapour phase epitaxy (VPE) systems and metal-organic chemical vapour deposition (MOCVD) reactors. Methods disclosed in WO 2017/029470 are preferably used to form a graphene layer structure on a substrate in the method disclosed herein.

Graphene is being investigated for a range of potential applications. Most notable is the use of graphene in electronic devices such as LEDs, photovoltaic cells, Hall-effect sensors, diodes and the like.

'Graphene Barristor, a Triode Device with a Gate-Controlled Schottky Barrier' by Yang et al, Science, Volume 336, 1140-1143, June 2012, provides a three-terminal active graphene device. This device is manufactured by transferring graphene onto pre-patterned silicon substrates. The pre-patterning was conducted on a 100 nm thick $SiO_2$ layer grown on a 6 inch wafer of doped silicon. Using photolithography and buffered oxide etch (BOE) processes, windows exposing bare Si underneath were fabricated with the dimension 2 µm by 4 µm.

CN 102157548 relates to a semiconductor field effect transistor based on a laminated stack of graphene and dielectric insulative layers wherein switch relies on Fowler-Nordheim tunnelling of electrons between layers of graphene through the dielectric insulative layers.

However, there remains a need for a method of manufacturing such electronic devices that are capable of delivering the potential that graphene offers, at least is terms of its theoretical electronic properties. There remains a need for a method which allows for the manufacture of a transistor comprising graphene along with the other components necessary to allow the electronic device to operate whilst also not being detrimental to the graphene properties.

SUMMARY OF THE INVENTION

It is an object of the present invention to provide an improved method for manufacturing a graphene transistor and a graphene transistor per se which overcome, or substantially reduce, problems associated with the prior art or at least provide a commercially useful alternative.

Accordingly, in a first aspect there is provided a method of manufacturing a graphene transistor, the method comprising:
 (a) providing a substrate having a substantially flat surface, wherein the surface comprises an insulating region and an adjacent semiconducting region;
 (b) forming a graphene layer structure on the surface, wherein the graphene layer structure is disposed on and across a portion of both the insulating region and the adjacent semiconducting region;
 (c) forming a layer of dielectric material on a portion of the graphene layer structure which is itself disposed on the semiconducting region; and
 (d) providing:
   a source contact on a portion of the graphene layer structure which is itself disposed on the insulating region;
   a gate contact on the layer of dielectric material and above a portion of the graphene layer structure which is itself disposed on the semiconducting region; and
   a drain contact on the semiconducting region of the substrate surface.

DETAILED DESCRIPTION

Figure 1:
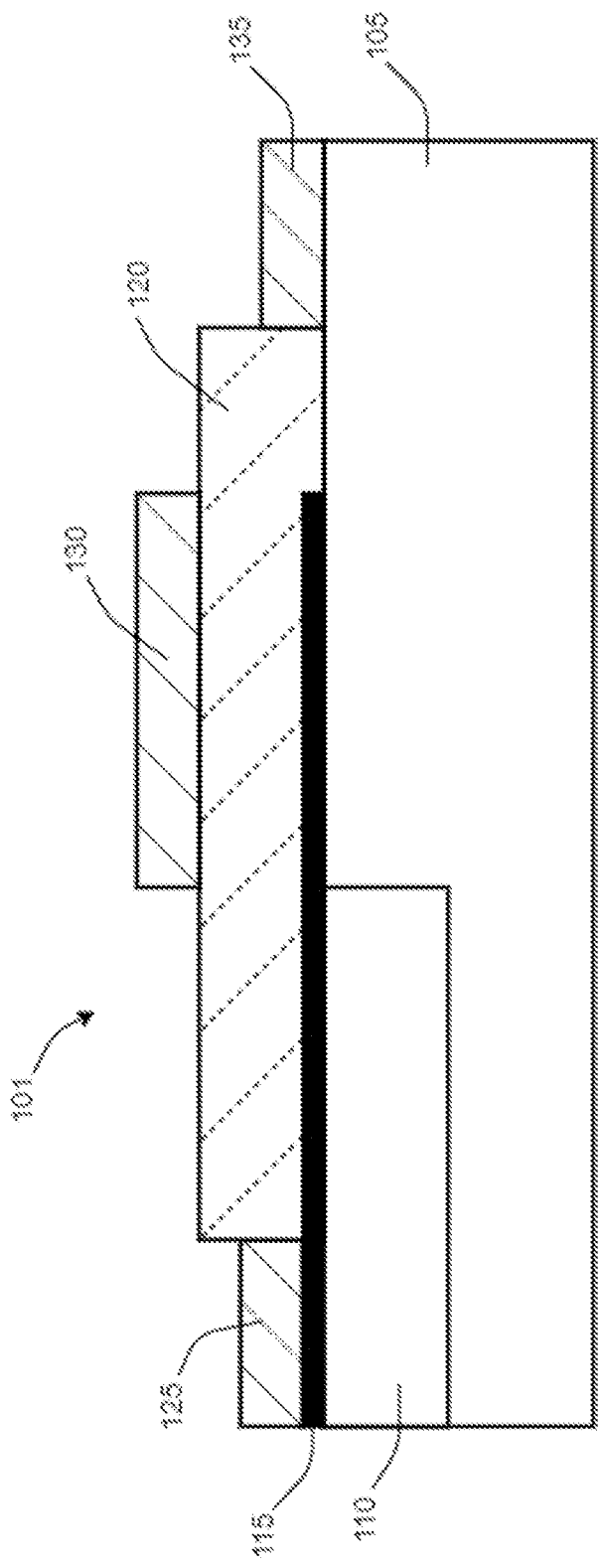
FIG. 1 shows a cross-section of a graphene transistor as described herein.

The present disclosure will now be described further. In the following passages, different aspects/embodiments of the disclosure are defined in more detail. Each aspect/embodiment so defined may be combined with any other aspect/embodiment or aspects/embodiments unless clearly indicated to the contrary. In particular, any feature indicated as being preferred or advantageous may be combined with any other feature or features indicated as being preferred or advantageous.

The method described herein provides a method for manufacturing a graphene transistor. A graphene transistor is a transistor which comprises graphene (also referred to herein as a graphene layer structure). Preferably, the method provides a graphene field-effect transistor which is a type of transistor which uses an electric field to modulate the flow of current. In the case of a graphene transistor, there is a flow of current through the graphene, with the graphene forming a channel region.

Field-effect transistors are known in the art and comprise a gate electrode (or contact) to which a voltage may be applied which in turn modulates the conductivity between the source and drain electrodes (contacts). Graphene is not generally considered for use in transistors since it is a zero band gap semiconductor. However, the inventors have found that its Fermi energy can be modified by a voltage applied to a gate contact. The work function of the graphene sheet can advantageously be adjusted over a wide range by tuning of the Fermi energy via the gate. The transistor as described herein therefore also demonstrates a temperature stable $I_{on}/I_{off}$ ratio where $I_{on}$ is current to turn on and $I_{off}$ is current to turn off.

The method comprises providing a substrate having a substantially flat surface wherein the surface comprises an insulating region and an adjacent semiconducting region. The surface also provides a further semiconducting region for providing a drain contact thereon as described herein. Typically, a substrate having both insulating and semiconducting regions will be provided by either treating a semiconductor substrate so as to provide an insulating region or by etching a semiconductor substrate and forming (or depositing) an insulator to fill the entire etched portion of the semiconductor substrate. Indeed, the parallel embodiment in both cases of providing an insulator substrate and forming the semiconducting region by equivalent methods may also be used in the method described herein to provide such a substrate. The substrate having at least one insulating region (i.e. a surface area that is insulating) has an adjacent semiconducting region (a surface area that is semiconducting). By adjacent, it is intended that the two surface area share a border such that they directly abut one another. It will be appreciated that on a large substrate (for example a 6 inch (15 cm) silicon substrate), multiple insulating regions may be formed for the manufacture of a plurality of graphene transistor on a single substrate.

Unless clearly indicated to the contrary, reference herein to a substrate may refer equally to either a precursor substrate (such as one having a uniform semiconductor or insulator surface) or a substrate modified so as to have an insulating region and a semiconducting region.

The semiconductor substrate may be any known in the art that is at least partially formed of a semiconductor material, such that the surface on which the transistor is to be formed is made of a semiconductor material. That is, the substrate could have a laminate structure with multiple layers, provided that the upper surface on which the graphene layer structure is to be formed is composed of semiconductor material.

The substrate may comprise silicon, germanium, silicon carbide and III-V semiconductor or combinations of two or more thereof. III-V semiconductor substrates may include binary III-V semiconductors such as GaN and AlN and also ternary, quaternary and higher order III-V semiconductors such as InGaN, InGaAs, AlGaN, InGaAsP. The substrate may comprise silicon, germanium, silicon carbide, and III-V semiconductors.

It will be understood that the technical benefit derived from the substantially flat substrate surface comes from the deposition of graphene across the flat surface as described herein. The substrate needs to provide a substantially flat portion in the area of the manufacture of the graphene transistor and that this therefore does not exclude a non-adjacent portion of the substrate, or an area of the surface of the substrate that is not in the immediate vicinity, having surface features. Preferably the entire substrate is flat, as with a conventional semiconductor wafer.

The total thickness of the substrate is typically 50 to 1500 μm, preferably 400 μm to 1200 μm. However, thicker substrates would also work and thick silicon wafers, for example, are up to 2 mm thick. The minimum thickness of the substrate is however determined in part by the substrate's mechanical properties and the maximum temperature at which the substrate is to be heated. The maximum area of the substrate may be dictated by the size of the reaction chamber when forming a graphene layer structure by MOCVD or VPE. Preferably, the substrate has a diameter of at least 15.2 cm (6 inches), preferably 15.2 to 61.0 cm (6 to 24 inches) and more preferably 15.2 to 30.5 cm (6 to 12 inches). The substrate can be cut after growth to form individual devices using any known method. The substrate may instead be cut after formation of the transistor (i.e. formation of the dielectric and contacts). This is particularly, preferable wherein a plurality of graphene transistors are manufactured concomitantly using the method described herein on a single substrate (such as a 6 inch (15 cm) wafer) and cutting provided a plurality of individual graphene transistors.

It is preferred that the substrate provides a crystalline surface upon which the graphene is produced as ordered crystal lattice sites provide a regular array of nucleation sites that promote the formation of good graphene crystal overgrowth. The most preferred substrates provide a high density of nucleation sites. The regular repeatable crystal lattice of substrates used for semiconductor deposition is ideal, the atomic stepped surface offering diffusion barriers.

It is particularly preferred that the semiconductor substrate is doped. When doped, the semiconductor substrate may be either p-type or n-type doped. Preferably, the doped semiconductor substrate has a dopant concentration of greater than $10^{15}$ cm$^{-3}$, more preferably greater than $10^{16}$ cm$^{-3}$ and/or less than $10^{20}$ cm$^{-3}$, preferably less than $10^{19}$ cm$^{-3}$. A most preferred range is from $10^{16}$ cm$^{-3}$ to $10^{18}$ cm$^{-3}$.

The method preferably comprises treating a first portion of the surface of a semiconductor substrate to form the insulating region whilst retaining an untreated second portion of the substrate (which is the semiconducting region of the substrate). That is, the remainder of the substrate surface remains untreated so that there is obtained a substrate having treated and untreated portions. Whilst the untreated portion may be referred to as a second portion, it will be appreciated a drain contact need be provided in the method described herein on the semiconductor surface of the substrate. A drain contact may be considered to be provided on a portion of the second portion of the substrate, or this may simply be considered a further portion of the semiconductor surface. In either case, the terminology differs but the meaning is intended to be the same. The step of treating a portion of the substrate comprises any method known in the art that is capable of modifying the electronic behaviour of the substrate, in this case to convert the portion of the semiconductor substrate from a semiconductor to an insulator.

Preferably before treating a first portion of the surface, it is preferable that the semiconductor substrate, or at least the surface thereof consists of a single material. Exemplary semiconductor substrates that may be used in the method include silicon, germanium, silicon carbide and III-V semiconductor substrates or combinations of two or more thereof. III-V semiconductor substrates may include binary III-V semiconductor substrates such as GaN and AlN and also tertiary, quaternary and higher order III-V semiconductor substrates such as InGaN, InGaAs, AlGaN, InGaAsP. Preferably, the semiconductor substrate is selected from silicon, germanium, silicon carbide, and III-V semiconductors. According to preferred embodiments, the substrate may be a light-emitting or light-sensitive device, such as an LED or a photovoltaic cell. Silicon, germanium, silicon carbide and/or III-V semiconductor substrates are preferred substrates for use in this embodiment. Silicon on insulator substrates are known in the art and may also be employed here.

GaN is a particularly preferable III-V semiconductor substrate. GaN has a particularly high breakdown voltage and high frequency of operation which is advantageous. When GaN is used as the substrate in the method as described herein, the method allows for the manufacture of a GaN transistor without introducing defects into the GaN layer through the use of a graphene layer structure on the surface rather than the use of layer stacks such as AlN and AlGaN which are required for GaN transistors in the prior art. Without wishing to be bound by theory, the inventors have found that lattice mismatch between the different materials (e.g. GaN and AlN) introduce defects which trap electrons when a voltage is applied to the transistor. This then results in the heating of the transistor over time and ultimately failure of the device. Accordingly, use of GaN in the method as described herein provides a transistor that is more reliable than prior art devices whilst also having high breakdown voltage.

Similarly, silicon carbide is a preferable substrate in particular embodiments. Silicon carbide based transistor are very reliable but are known to suffer with low electron mobilities and therefore low switching frequencies. Use of silicon carbide as a substrate in the method described herein, which utilises a graphene layer structure having high electron mobility, therefore allows for a silicon carbide transistor having improved switching frequencies whilst maintaining high breakdown voltages and reliability.

In one preferred embodiment, the step of treating a first portion of the semiconductor substrate comprises treating the surface by ion implantation. In such an embodiment, the precursor substrate is preferably a silicon or silicon carbide substrate. In one exemplary embodiment, ion implantation may be used to treat a first portion of a silicon substrate so as to provide a portion of the substrate formed of silicon dioxide and/or silicon nitride thereby transforming a portion of the substrate, and a surface thereof, into an insulating region whilst retaining a semiconducting region.

Even more preferably, the method comprises applying a mask before the step of treating the substrate so as to allow for a controlled patterning of the substrate with at least one portion that is insulative having a desired configuration, shape and/or dimensions.

In an alternatively preferred embodiment, the step of treating a portion of the substrate comprises etching the surface of the substrate to reduce the thickness of a portion of the surface of the substrate (preferably starting from a semiconductor substrate). This step may be carried out using a mask to selectively etch away a specific portion of the substrate. GaN substrates are particularly preferred for embodiments wherein a portion is etched away and replaced with an insulating material.

When starting from a semiconductor substrate, the method then further comprises the step of forming an insulator in the etched portion to form an insulating region in the etched first portion of the substrate. The insulator formed has to be of substantially the same thickness (and dimensions) as that of the portion of the substrate previously etched away so as to provide the final substrate for graphene formation having a substantially flat substrate surface as is required (i.e. no steps, discontinuities or regions of different thickness). Preferably, a mask is also used to form the insulator so as to form the insulator only in the region of the etched substrate. The insulator material is not particularly limited and may be any insulator known in the art. For example, the insulator may preferably be a material commonly used in device manufacture such as $Al_2O_3$, $SiO_2$, SiN.

Whilst this embodiment requires additional steps and care need be taken to ensure a substantially flat substrate surface is maintained, the method is more amenable for any substrate as described herein to be used.

As discussed herein, the method applies equally to insulating substrates, i.e. those at least partially formed of an insulating material, such that the surface on which the transistor is to be formed is made of an insulating material. In such embodiments, a semiconducting portion is provided. This may be achieved, for example, by etching a silicon dioxide substrate and forming a layer of germanium in the etched portion to provide a semiconducting region.

A substantially flat substrate surface is one having substantially no steps or discontinuities. The substrate may be considered to be one having a difference in thickness (between maximum and minimum thickness, which includes this difference in thickness at the boundary/junction of the insulator/semiconductor surface of the substrate) of less than 50 nm, such as less than 10 nm, preferably less than 5 nm and preferably less than 1 nm. A substantially flat substrate surface may also be considered to be one having a mean surface roughness (Ra) of less than 100 nm, such as less than 50 nm and preferably less than 10 nm.

Preferably, a portion of the semiconductor substrate surface is treated to form an insulating region that has a thickness of at least 2 nm, preferably at least 10 nm, and/or less than 600 nm, preferably less than 400 nm. Therefore, the region may have a thickness of from 2 nm to 500 nm, preferably from 5 nm to 300 nm, even more preferably from 10 nm to 250 nm. Such a thickness may be achieved by, for example, ion implantation or by etching away such a thickness and depositing substantially the same thickness of insulator in the etched portion of the substrate. The thickness of the insulating region refers to the depth of insulating region in the substrate as it extends from the substantially flat surface. The depth of the insulating region may extend the full thickness of the substrate and is not particularly limited. The depth preferably extends less than 50% of the thickness of the substrate, preferably from 1% to 25%, more preferably from 2% to 10%.

As used herein, graphene is described as a graphene layer structure. The method involves a step of forming a graphene layer structure on the surface, wherein the graphene layer structure is disposed on and across at least a portion of the insulating region and an adjacent portion of the semiconducting region. The graphene layer structure may be a graphene monolayer or may comprise a plurality of graphene monolayers and in particular, preferably consists of graphene monolayers (or graphene sheets). The graphene layer structure may comprise from 1 to 100 layers, preferably from 1 to 50, more preferably from 1 to 20 layers and most preferably from 1 to 10 layers. Preferably, the graphene layer structure comprises a single graphene layer so as to provide the unique and advantageous electronic properties associated with monolayer graphene (such as a substantially zero band gap). The inventors have found that a single graphene monolayer is particularly advantageous as this enables a lower switching voltage (via a greater shift in the Fermi level) in the final transistor.

Multilayer graphene offers advantageous properties for the transistor such as improved conduction of both current and heat. However, it is preferred that the graphene disposed on the semiconducting region (which is used to form the gate) is as thin as possible (ideally a single graphene monolayer). It is easier to modulate the density of states in a single graphene monolayer in the gate region. Thus, the number of layers can be a compromise between current and heat conduction and efficiency of the gate operation.

In a preferred embodiment, the graphene layer structure is a multilayer graphene structure (i.e. having a thickness of n graphene monolayers, wherein n is at least 2) and a portion of the graphene layer structure may be etched to reduce the thickness of the graphene layer structure to from n−1 to 1 graphene monolayers over at least a portion of the semiconducting region (preferably only a portion of the semiconducting region and/or even more preferably over all of the semiconducting region where the graphene layer structure is provided). Most preferably, the graphene layer structure thickness is reduced to a single graphene monolayer. Such a process is described in the co-filed GB application entitled "A Method of Manufacturing a Graphene-Semiconductor Transistor" and is incorporated herein by reference. Both of these methods provide (at least in effect) a single graphene monolayer for use in a gate region of a transistor. Multilayer graphene may then be maintained elsewhere in the device for its advantageous properties, such as conduction.

The step of forming a graphene layer structure on the substrate may be achieved by any method known in the art, preferably wherein the graphene is synthesised directly on the surface of the substrate and therefore does not involve any physical transfer steps. It is particularly preferable that the graphene layer structure is formed by VPE or MOCVD. MOCVD is a term used to describe a system used for a particular method for the deposition of layers on a substrate. While the acronym stands for metal-organic chemical vapour deposition, MOCVD is a term in the art and would be understood to relate to the general process and the apparatus used therefor and would not necessarily be considered to be restricted to the use of metal-organic reactants or to the production of metal-organic materials but would simply require the use of a carbon containing precursor. Instead, the use of this term indicates to the person skilled in the art a general set of process and apparatus features. MOCVD is further distinct from CVD techniques by virtue of the system complexity and accuracy. While CVD techniques allow reactions to be performed with straight-forward stoichiometry and structures, MOCVD allows the production of difficult stoichiometries and structures. An MOCVD system is distinct from a CVD system by virtue of at least the gas distribution systems, heating and temperature control systems and chemical control systems. An MOCVD system typically costs at least 10 times as much as a typical CVD system. MOCVD is particularly preferred for achieving high quality graphene layer structures.

MOCVD can also be readily distinguished from atomic layer deposition (ALD) techniques. ALD relies on step-wise reactions of reagents with intervening flushing steps used to remove undesirable by products and/or excess reagents. It does not rely on decomposition or dissociation of the reagent in the gaseous phase. It is particularly unsuitable for the use of reagents with low vapour pressures such as silanes, which would take undue time to remove from the reaction chamber. MOCVD growth of graphene is discussed in WO 2017/029470 which is incorporated by reference and provides the preferred method. The inventors have discovered that such a method is capable of forming graphene across a substrate having two or more distinct regions as described herein (i.e. graphene may be formed across a portion of an insulating region and an adjacent semiconducting region of a substrate comprising both an insulator and a semiconductor).

The method of WO 2017/029470 provides two-dimensional materials with a number of advantageous characteristics including: very good crystal quality; large material grain size; minimal material defects; large sheet size; and being self-supporting. The inventors have found that equivalent quality graphene can be formed on such a substrate having distinct regions, the graphene maintaining the advantageous qualities suitable for use in a graphene transistor as described herein.

The method of WO 2017/029470 provides a chamber which has a plurality of cooled inlets arranged so that, in use, the inlets are distributed across the substrate and have a constant separation from the substrate. The flow comprising a precursor compound may be provided as a horizontal laminar flow or may be provided substantially vertically. Inlets suitable for such reactors are well known and include Planetary and Showerhead reactors available from Aixtron®. Other suitable growth chambers include Turbodisc K-series or Propel MOCVD systems available from Veeco Instruments Inc.

Accordingly, in one particularly preferred embodiment, the step of forming the graphene layer structure comprises:
providing the substrate on a heated susceptor in a reaction chamber, the chamber having a plurality of cooled inlets arranged so that, in use, the inlets are distributed across the substrate and have a constant separation from the substrate,
supplying a flow comprising a precursor compound through the inlets and into the reaction chamber to thereby decompose the precursor compound and form the graphene on the substrate,
wherein the inlets are cooled to less than 100° C., preferably from 50° C. to 60° C., and the susceptor is heated to a temperature of at least 50° C. in excess of a decomposition temperature of the precursor.

The graphene layer structure may be a doped graphene layer structure. Where the graphene layer structure is doped, the graphene is preferably doped with one or more elements selected from the group consisting of silicon, magnesium, zinc, arsenic, oxygen, boron, bromine and nitrogen. Likewise, the method may then preferably comprise introducing a doping element into the reaction chamber and selecting a temperature of the substrate, a pressure of the reaction chamber and a gas flow rate to produce a doped graphene. Preferably, the precursor for doped graphene growth includes the doping element. Alternatively, the precursor comprising the species (which is carbon) and one or more further precursors comprising the doping element are introduced to the substrate within the reaction chamber; the second precursor being a gas or suspended in gas, to produce a doped graphene.

Regardless of the method used to form the graphene layer structure on the substrate, the graphene layer structure is disposed on and across a portion of the insulating region and an adjacent (abutting) portion of the semiconducting region. Accordingly, the graphene layer structure comprises a graphene monolayer (i.e. a monolayer of graphene or a graphene sheet) that is simultaneously in contact with a portion of the insulating region and a portion of the adjacent semiconducting region. In other words, one of the graphene sheets is provided in direct contact with a portion of both the insulating region and the adjacent semiconducting region. That is, the bottom most layer of the graphene layer structure which it that directly on and across a portion of the insulating and semiconducting regions of the substrate, is a graphene layer thereby forming a Schottky barrier in a portion at the interface with the semiconducting region of the substrate, and which lies beneath the gate contact. Accordingly, a gate voltage may be applied to modulate the graphene Fermi level and the barrier height so as to control current flow. This is most effective where the graphene on the semiconducting region of the substrate is monolayer graphene.

In one preferred embodiment, the graphene has undetectable discontinuity, as measured by standard Raman and AFM mapping techniques to micron scale prior to the subsequent deposition of the dielectric layer as described herein. That is, the graphene has a continuous interface across the substrate and across both portions of the insulating and semiconducting regions, including the junction between the two regions. The skilled person is readily capable of determining the quality of graphene at this stage by such Raman and AFM techniques. Thus, the graphene is formed on the substrate without the introduction of any deformities (such as dislocations, steps, crinkles and/or cracks) in the graphene.

The inventors have found that graphene transfer processes known in the art introduce wrinkles and/or cracks into the graphene which influence many electronic properties of the graphene layer. Deformations in the graphene layer such as these can create electron-hole puddles, band-gap openings and carrier scattering. By extension, graphene samples that have been transferred by methods known in the art can suffer from being non-uniform from one sample to the next. It is difficult to reliably provide graphene having identical properties from one sample to the next given how the extent of creasing and/or rippling in one sample may differ substantially from that of another prepared by the same method due to the physical uncertainties associated with physical transfer processes. In other words, the physical manipulation of graphene post synthesis may give rise to sustainably different levels of stress and/or strain being applied to the sample, particularly where graphene is transferred onto substrates which are not substantially flat where there is an increased risk of damaging the graphene. Similarly, ensuring consistent and uniform pressure to apply the graphene to the new substrate is known to be problematic. Moreover, the step of removing the carrier, which is typically a polymer carrier used to remove graphene from, for example, a catalytic copper growth substrate, is also problematic. Removal of the polymer carrier may comprise dissolving the polymer with a solvent which may give rise to inconsistent levels of doping and therefore inconsistent graphene transistor products. Such methods are therefore not as appropriate for large scale production as MOCVD where consistency is required.

Similarly, the same problems are found when graphene is provided over a substrate step so as to be non-planar. These morphological deformations of the graphene limit carrier mobility through carrier scattering and therefore limit the effectiveness of graphene in a transistor. Steps as little as 1 nm in height can have a detrimental effect of the graphene's electronic properties, particularly steps of 10 nm or greater. As described herein, prior art graphene transistors have been known to comprise graphene that steps from $SiO_2$ insulator to an underlying silicon substrate with a height of 100 nm. The inventors have found that the method and transistor as described herein show an improvement over prior art transistors due to the planarity and lack of deformation in the graphene layer.

The method further comprises forming a layer of dielectric material on a portion of the graphene layer which is itself disposed on the semiconducting region. Accordingly, the layer of dielectric material may be formed/deposited on the entirety of the portion of the graphene layer structure which is itself disposed on the semiconducting region (which is preferable in view of the protective properties of the dielectric material). The material is capable of forming a barrier so as to avoid the unwanted oxidation, doping, and/or contamination of the graphene layer. Moreover, the layer of dielectric material may comprise multiple layers of dielectric materials. In one exemplary embodiment, the layer of dielectric material comprises a first layer of silicon nitride and a second layer of silicon dioxide. In such an embodiment, a thin silicon nitride layer may be formed on the graphene to provide a barrier and a thicker silicon dioxide layer may be formed thereon to achieve the desired thickness of the layer of dielectric material. However, the method simply requires the dielectric material be formed on a portion of the graphene layer structure which is not disposed upon the insulating region in order to provide a transistor having improved electronic properties over the prior art.

The dielectric material may comprise any material known in the art to be dielectric. Accordingly, the dielectric material is electrically insulating and typically has a high dielectric constant unlike a classic insulator. The dielectric constant (k) of the dielectric material may be greater than 2, preferably greater than 3 and even more preferably greater than 4 (when measured at 1 kHz at room temperature). In some applications for the transistor, such as high frequency applications, it may preferable for the dielectric constant of the dielectric material to be lower than that which may be used in other applications, such as low frequency applications. Accordingly, k may be less than 10, preferably less than 6. Dielectric materials may therefore polarise in an electric field. Exemplary dielectric materials for use in the method described herein include one or more of PMMA, PVA, PVB, LiF, $Al_2O_3$, ZnO, $TiO_2$, $ZrO_2$, $SrO_2$, $HfO_2$, SiN, $SiO_2$, AlN, AlGaN, AlGaAs, AlN, and AlP. Further dielectric materials which may be used alone or in combination with these include $Y_2O_3$ (yttria), $CaF_2$, $MgF_2$ and/or $Ta_2O_3$.

For example, the dielectric material may be a nanolaminate structure consisting of plurality of different layers of such dielectric materials, each having an individual thickness of less than 10 nm, preferably less than 5 nm. In one preferred embodiment, the dielectric material includes $Al_2O_3$ and $HfO_2$, and preferably is a nanolaminate of $Al_2O_3$ and $HfO_2$.

Preferably, the layer of dielectric material has a thickness of less than 300 nm, such as less than 200 nm, less than 150 nm, preferably less than 100 nm and/or greater than 1 nm, such as greater than 5 nm, preferably greater than 10 nm. Accordingly, the dielectric layer may have a thickness of between 1 nm and 300 nm, preferably between 1 nm and 100 nm.

The dielectric layer may be formed by any appropriate technique known in the art to the skilled person. Deposition of an inorganic dielectric, such as a metal oxide, may be achieved by molecular beam deposition (MBD), atomic layer deposition (ALD), chemical vapour deposition (CVD), metal-organic chemical vapour deposition (MOCVD) and/or physical vapour deposition (PVD). Alternatively, deposition of a dielectric may be achieved using standard photolithography techniques. Photolithography techniques are particularly suitable for the deposition of an organic dielectric material, such as one comprising PMMA. As with the deposition techniques above, a mask may be used to selectively deposit and/or pattern the dielectric material on the graphene. For example, the PMMA resist may be applied to the entirety of the substrate (or at least all of the deposited graphene including any or all of the portion which is disposed on the insulating region) and a mask applied so as to expose at least the portion disposed on the insulating region to radiation. The exposed PMMA resist may be developed and subsequently removed so as to expose this portion of graphene.

The method further comprises the step of providing a source contact on a portion of the graphene layer which is itself disposed on the insulating region, a gate contact on the layer of dielectric material wherein the gate contact is also above a portion of the graphene layer structure which is itself disposed on the semiconducting region, and a drain contact on the semiconducting region of the substrate.

Much like the dielectric layer, the three contacts may be provided by any technique known in the art to the skilled person. The step of providing said contacts may comprise using a mask to selectively deposit the contact(s) on the specific portions of the transistor layers as required by the method described herein (i.e. on a portion of the graphene disposed on the insulating region so that contact is only electrically connected to the semiconductor through the graphene; on a portion of the layer of dielectric material (and above a portion of the graphene layer structure which is disposed on the semiconducting region); and directly on a portion of a semiconducting region of the substrate (including portions which are not on the substantially flat surface).

The source contact is provided on a portion of the graphene layer which is itself disposed on the insulating region. That is, the contact is preferably only in contact with the graphene layer.

The gate contact being on the layer of dielectric material and above a portion of the graphene layer structure which is itself disposed on the semiconducting region, is intended to mean that the contact is simultaneously on the dielectric and above the graphene (so as to provide a gate structure wherein the dielectric material forms an intervening layer between the contact and the graphene). Ideally the gate contact is over the area where the graphene and the semiconductor and nowhere else, although small overlaps on the order of nm would be immaterial. That is, preferably the gate contact does not extend to any regions of the dielectric material that are not themselves on a portion of the graphene layer structure.

Preferably, the drain contact provided on the semiconducting region of the substrate is provided such that it does not abut (or adjoin, or border) the semiconducting region of the substrate having the graphene layer structure disposed thereon. Nevertheless, the drain contact will typically be provided next to this portion of the graphene on the semiconducting region so as to be arranged distal to the source contact. Such an arrangement of drain and source contacts relative to the gate contact which lies therebetween is conventional in the art so as to modulate current flow between the source and drain and is known to the skilled person so as to provide a transistor. The drain contact can be provided on an opposite surface of the semiconducting portion of the substrate from the graphene layer.

Thus, the gate contact is provided between the source and drain contacts relative to the plane of the substrate. Preferably, there is a gap between the graphene layer structure disposed on the semiconducting region and the drain contact disposed on a further semiconducting region, the gap being at least 1 nm, preferably at least 5 nm and most preferably at least 10 nm, It is particularly preferred that the layer of dielectric material as described herein is disposed in the gap and on the exposed portion of substrate between the graphene layer structure and drain contact. It is desirable to avoid overlap with the semiconductor, since that might affect the 'uniformity' of the transport within the Graphene (e.g. some lateral variation in Schottky barrier).

As will be appreciated by the skilled person, the method comprises the steps described herein and may be performed in any relevant order. For example, the contacts may be provided in separate steps as is known in the art. The step of providing any contact may be before or after any other steps in the method described herein. For example, the source and drain may be provided after the step of forming graphene yet before the step of forming a layer of dielectric material on a portion of the graphene. The source and drain contacts can be reversed when connected to a circuit from the preferred embodiment described above.

The contacts preferably comprise one or more of titanium, chromium and gold, preferably chromium and/or gold. The contacts are preferably deposited by electron beam deposition, preferably using a mask. Whilst the size and composition of the three contacts (source, gate and drain) may be the same or different, the terminology used will be understood by the person skilled in the art as specific contacts for use in incorporation into an electrical device. In other words, once electrical connections are provided on the contacts, the skilled person would understand how these are subsequently circuited to form the electronic device (transistor).

In a further aspect there is provided a graphene transistor comprising:
  a substrate having a substantially flat surface wherein the surface comprises an insulating region and an adjacent semiconducting region;
  a graphene layer structure disposed on the surface, wherein the graphene layer structure is disposed on and across a portion of both the insulating region and the adjacent semiconducting region;
  a layer of dielectric material on a portion of the graphene layer structure which is itself disposed on the semiconducting region;
  a source contact on a portion of the graphene layer structure which is itself disposed on the insulating region;
  a gate contact on the layer of dielectric material and above a portion of the graphene layer structure which is itself disposed on the semiconducting region; and
  a drain contact on the semiconducting region of the substrate surface.

The graphene transistor as described herein may be obtainable by, and preferably is obtained by, the method described herein. Accordingly, in another aspect, there is provided a graphene transistor obtainable by the method described herein. In yet another aspect, there is provided a device comprising the graphene transistor described herein.

The substantially flat graphene layer deposited on the substrate having a substantially flat surface comprising an insulating region and a semiconducting region provides the advantageous electronic properties as discussed herein.

Accordingly, the inventors have been able to provide a device comprising a transistor having improved properties such as rectification ratio and the ability to fine tune the work function of the graphene allowing a large shift of diode threshold voltages.

According to a particularly preferred embodiment, the invention provides a method of manufacturing a graphene transistor, the method comprising:
  (a) providing a semiconductor substrate having a substantially flat surface;
  (b) treating a first portion of the surface of the semiconductor substrate to form the insulating region and wherein an untreated second portion of the surface of the semiconductor substrate is the adjacent semiconducting region;
  (c) forming a graphene layer structure on the surface, wherein the graphene layer structure is disposed on and across a portion of both the insulating region and the adjacent semiconducting region;
  (d) forming a layer of dielectric material on a portion of the graphene layer structure which is itself disposed on the semiconducting region; and
  (e) providing:
    a source contact on a portion of the graphene layer structure which is itself disposed on the insulating region;
    a gate contact on the layer of dielectric material and above a portion of the graphene layer structure which is itself disposed on the semiconducting region; and
    a drain contact on the semiconducting region of the substrate surface.

Preferably the semiconductor substrate comprises silicon and the insulating region comprises silicon dioxide or silicon nitride obtained by treating a first portion of the substrate by ion implantation. Preferably the graphene is formed by MOCVD or VPE as described herein.

According to a particularly preferred embodiment, the invention provides a graphene transistor comprising:
  a substrate having a substantially flat surface wherein the surface comprises an insulating region and a an adjacent semiconducting region, wherein the semiconducting region is silicon and the insulating region comprises silicon dioxide or silicon nitride;
  a graphene layer structure, preferably comprising 1 to 10 layers, disposed on the surface, wherein the graphene layer structure is disposed on and across a portion of both the insulating region and the adjacent semiconducting region;
  a layer of dielectric material on a portion of the graphene layer structure which is itself disposed on the semiconducting region;
  a source contact on a portion of the graphene layer structure which is itself disposed on the insulating region;
  a gate contact on the layer of dielectric material and above a portion of the graphene layer structure which is itself disposed on the semiconducting region; and
  a drain contact on the semiconducting region of the substrate surface.

Semiconductors and insulators are well known in the art. In the context of the present invention a semiconductor substrate having an insulating region may at least be identified based on the insulating region having a lower conductivity than the semiconductor region. Where the material is obtained by ion implantation of a continuous substrate, this change in conductivity will clearly define the discussed portions. Where the material is obtained by etching and replacing material, the portions may be clearly visible.

Preferably the difference in conductivity as measured at room temperature between the semiconductor and the insulator is at least 1 and preferably at least 2 orders of magnitude and more preferably at least 3 orders of magnitude (i.e. the conductivity of the semiconductor is at least 10 times and preferably at least 100 times greater than that of the insulator). Preferably a semiconductor is a material which has a conductivity as measured at room temperature of greater than $10^{-5}$ S/cm preferably at least $10^{-4}$ S/cm. Preferably an insulator is a material which has a conductivity as measured at room temperature of less than $10^{-6}$ S/cm, preferably at most $10^{-6}$ S/cm.

Figure 2:
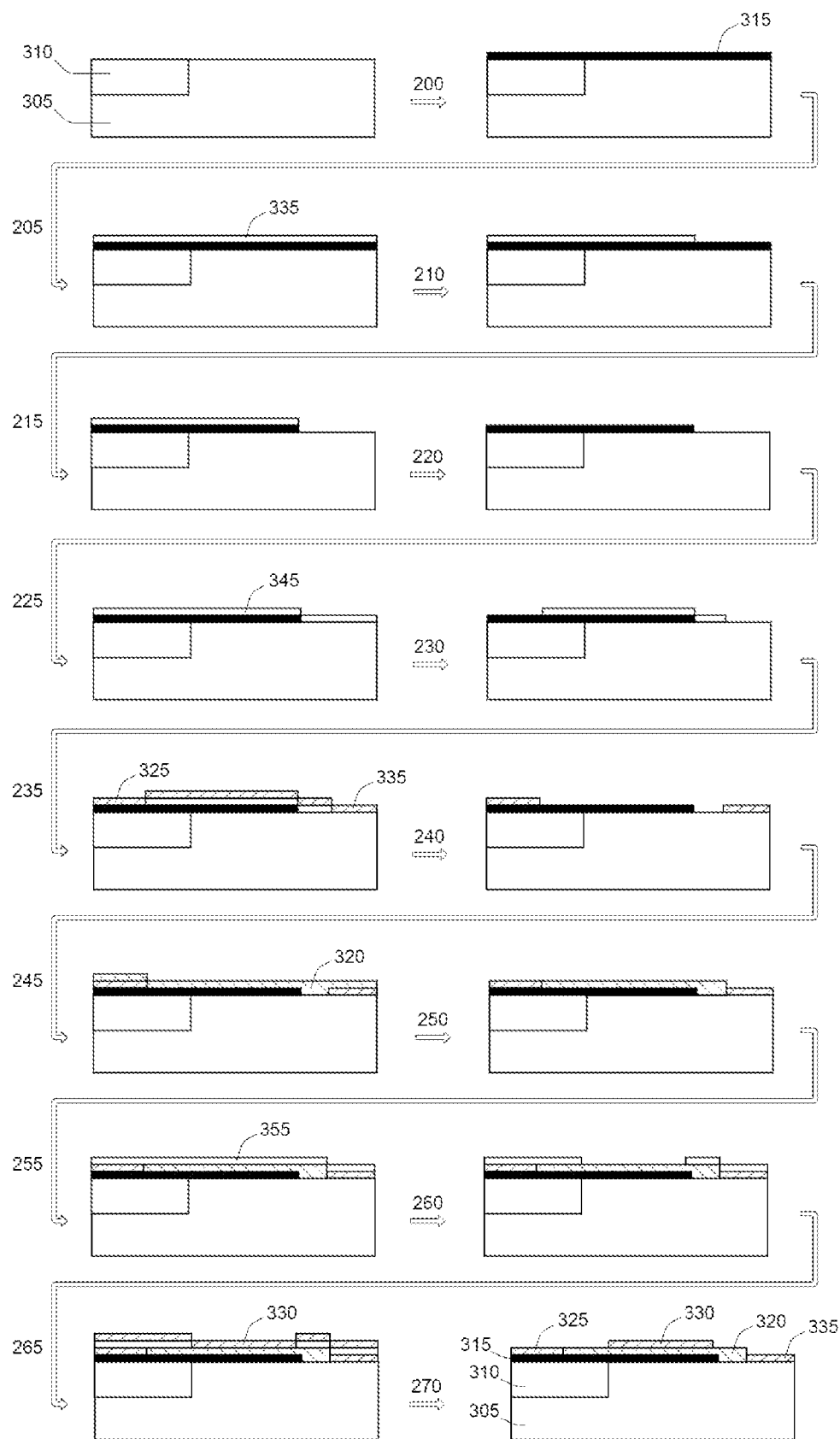
FIG. 2 illustrates an exemplary method of manufacturing a graphene transistor in accordance with the present invention.

The present invention will now be described further with reference to the following non-limiting Figures, in which FIG. 1 shows a cross-section of a graphene transistor as described herein. FIG. 2 illustrates an exemplary method of manufacturing a graphene transistor in accordance with the present invention.

FIG. 1 shows a cross-section of an exemplary graphene transistor 101 in accordance with the present invention. The graphene transistor 101 comprising a semiconductor substrate 105 having a substantially flat surface that comprises an insulating region 110. The insulating region 110 may be formed by ion implantation. The substantially flat semiconductor substrate retains a semiconducting region. The graphene transistor 101 further comprises a graphene layer structure 115 disposed on the surface of the substrate 105. The graphene layer structure 115 is disposed across a portion of the insulating region 110 and an adjacent portion of the semiconducting region of the substrate 105. The graphene transistor 101 further comprises a layer of dielectric material 120 on the entire portion of the graphene layer structure 115 which is not disposed upon the insulating region. The layer of dielectric material 120 is further disposed on a portion of the graphene layer structure 115 which is disposed on the insulating region 110 and a further semiconducting region of the substrate 105. Finally, the graphene transistor 101 comprises three electrical contacts: a source contact 125 on a portion of the graphene layer structure which is disposed on the insulating region 110, a drain contact 135 on a further semiconducting region of the substrate 105 (i.e. a semiconducting region of the substrate which does not have the graphene layer structure 115 thereon), and a gate contact 130 on a portion of the layer of dielectric material 120, the gate and dielectric portion being entirely above the portion of the graphene layer structure 115 which is deposited on the semiconducting region.

FIG. 2 illustrates an exemplary method of manufacturing a graphene transistor in accordance with the present invention. In particular, the method illustrated in FIG. 2 exemplifies a method of manufacturing a graphene transistor which includes standard photolithography techniques.

The method comprises providing a moderately doped ($\sim 10^{17}$ cm$^{-3}$) n-type silicon substrate 305 having a substantially flat surface, wherein the surface comprises an insulating region 310 consisting of silicon dioxide and an adjacent semiconducting region (consisting of the doped silicon of the original substrate. Such a substrate having both insulating and semiconducting surfaces can be provided by ion implantation of a doped silicon substrate to generate the silicon dioxide region. Ion implantation allows for the simple manufacture and provision of a substrate with different regions of insulator and semiconductor whilst maintaining a substantially flat surface for the subsequent growth of graphene.

The method further comprises step 200 of forming a graphene layer structure 315 on the surface of the substrate 305 by a method disclosed herein with reference to WO 2017/029470, wherein the graphene layer structure 315 is disposed on and across the insulating region 310 and the adjacent semiconducting region of the substrate. In step 205, a first resist 335 is spin-coated on the graphene layer structure 315. The first resist 335 is developed 210 using standard photolithography techniques (such as through exposure of the resist to UV radiation through a mask). The development 210 of the first resist may comprise dissolving the developed resist to expose a portion of the underlying graphene layer structure 315. Specifically, in the exemplary method, the exposed portion of the graphene layer structure 315 will provide the location for the drain contact 335. Accordingly, step 225 involves etching the exposed portion of the graphene layer structure 315 to expose the underlying substrate, in particular, a semiconducting region of the underlying substrate (the remaining graphene layer structure remains disposed across the insulating region 310 and an adjacent semiconducting region). The remainder of the first resist 335 is stripped from the graphene layer structure 315.

In equivalent steps, the method further comprises a step 225 of spin-coating a second resist 345 and development 230 of the second resist 345 to expose a portion of the graphene layer structure 315 disposed on the insulating region 310 as well as a portion of the underlying semiconducting region of the substrate that is not adjacent to the graphene layer structure 315.

A source contact 325 and drain contact 335 (which are chromium/gold stacks) are then provided in a single metallisation step 235, such as by thermal evaporation. Thermal evaporation simultaneously deposits the source contact 325 on the exposed graphene layer structure 315 and the drain contact 335 on the exposed semiconducting surface of the substrate 305. Metal is concomitantly deposited on the second resist 345. However, the excess metal is removed in a lift-off process 240 which removes the resist and the excess metal deposited thereon.

The method comprises step 245 forming a layer of dielectric material 320 on at least a portion of the graphene layer structure 315 which is not disposed on the insulating region 310 (i.e. a portion of the graphene layer structure 315 which is disposed on the semiconducting region of the substrate). In step 245, the layer of dielectric material 320 is deposited across the source 325 and drain 335 contacts as well as a portion of the graphene layer structure 315 which is disposed on the insulating region 310 as well as any exposed surface of the underlying substrate 305. This completely encapsulates the graphene layer structure 315. The layer of dielectric material 320 is developed and etched 250 using standard techniques to remove the excess material and expose the source 325 and drain 335 contacts.

The method further comprises a step 255 of spin-coating a third resist 355. As with steps 205/210 and 225/230, the third resist 355 is developed 260 to expose a portion of the layer of dielectric material 320, specifically at least a portion of the layer of dielectric material 320 which is above the portion of the graphene layer structure 315 which is deposited on the semiconducting region.

Metallisation 265 and lift-off 270 steps provide the gate contact 330 of the graphene transistor, the gate contact 330 being entirely above the portion of the graphene layer structure 315 which is deposited on the semiconducting region.

As used herein, the singular form of "a", "an" and "the" include plural references unless the context clearly dictates otherwise. The use of the term "comprising" intended to be interpreted as including such features but not (necessarily) limited to is also intended to include the option of the features necessarily being limited to those described. In other words, the term also includes the limitations of "consisting essentially of" (intended to mean that specific further components can be present provided they do not materially affect the essential characteristic of the described feature) and "consisting of" (intended to mean that no other feature may be included such that if the components were expressed as percentages by their proportions, these would add up to 100%, whilst accounting for any unavoidable impurities), unless the context clearly dictates otherwise.

It will be understood that, although the terms "first", "second", etc. may be used herein to describe various elements, layers and/or portions, the elements, layers and/or portions should not be limited by these terms. These terms are only used to distinguish one element, layer or portion from another, or a further, element, layer or portion. It will be understood that the term "on" is intended to mean "directly on" such that there are no intervening layers between one material being said to be "on" another material. Spatially relative terms, such as "below", "beneath", "lower", "above", "upper" and the like, may be used herein for ease of description to describe one element or feature's relationship to another element(s) or feature(s). It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented and the spatially relative descriptors used herein interpreted accordingly.

The foregoing detailed description has been provided by way of explanation and illustration, and is not intended to limit the scope of the appended claims. Many variations in the presently preferred embodiments illustrated herein will be apparent to one of ordinary skill in the art, and remain within the scope of the appended claims and their equivalents.

What is claimed is:

1. A method of manufacturing a graphene transistor, the method comprising:
    (a) providing a substrate having a substantially flat surface, wherein the surface comprises an insulating region and an adjacent semiconducting region;
    (b) forming a graphene layer structure on the surface, wherein the graphene layer structure is disposed on and across a portion of both the insulating region and the adjacent semiconducting region;
    (c) forming a layer of dielectric material on a first portion of the graphene layer structure, wherein the first portion of the graphene layer structure is disposed entirely on the semiconducting region; and
    (d) providing a source contact on a second portion of the graphene layer structure, wherein the second portion of the graphene layer structure is disposed entirely on the insulating region;
    a gate contact on the layer of dielectric material and entirely above the first portion of the graphene layer structure; and a drain contact on the semiconducting region of the substrate surface.

2. The method according to claim 1, wherein the substrate is provided by treating a first portion of a surface of a semiconductor substrate to form the insulating region and wherein an untreated second portion of the surface of the semiconductor substrate is the adjacent semiconducting region.

3. The method according to claim 2, wherein the step of treating the first portion of the surface of the semiconductor substrate comprises ion implantation.

4. The method according to claim 1, wherein the substrate is provided by:
(i) etching the surface of a semiconductor substrate to reduce the thickness of a first portion of the surface of the semiconductor substrate; and
(ii) forming an insulator in the etched first portion to form the insulating region.

5. The method according to claim 2, wherein the semiconductor substrate comprises silicon, germanium or a 111-V semiconductor.

6. The method according to claim 2, wherein the semiconductor substrate is doped.

7. The method according to claim 6, wherein the doped substrate has a dopant concentration of greater than $10^{15}$ cm$^{-3}$ and/or less than $10^{20}$ cm$^{-3}$.

8. The method according to claim 1, wherein the substrate has a thickness of less than 2 mm.

9. The method according to claim 1, wherein the insulating region has a thickness of from 2 nm to 500 nm.

10. The method according to claim 1, wherein the layer of dielectric material has a thickness of less than 300 nm.

11. The method according to claim 1, wherein the layer of dielectric material comprises any one or more of PMMA, LiF, $Al_2O_3$, ZnO, $HfO_2$, SiN and $SiO_2$.

12. The method according to claim 1, wherein the step of forming the graphene layer structure involves directly synthesizing graphene on the surface.

13. The method according to claim 12, wherein the graphene has undetectable discontinuity, as measured by standard Raman and AFM mapping techniques to micron scale prior to deposition of the dielectric layer.

14. The method according to claim 1, wherein the graphene layer structure is a doped graphene layer structure.

15. A method of manufacturing a graphene transistor, the method comprising:
(a) providing a substrate having a substantially flat surface, wherein the surface comprises an insulating region and an adjacent semiconducting region;
(b) forming a graphene layer structure on the surface, wherein the graphene layer structure is disposed on and across a portion of both the insulating region and the adjacent semiconducting region;
(c) forming a layer of dielectric material on a portion of the graphene layer structure which is itself disposed on the semiconducting region; and
(d) providing:
a source contact on a portion of the graphene layer structure which is itself disposed on the insulating region;
a gate contact on the layer of dielectric material and above a portion of the graphene layer structure which is itself disposed on the semiconducting region; and
a drain contact on the semiconducting region of the substrate surface;
wherein the step of forming the graphene layer structure comprises:
providing the substrate on a heated susceptor in a reaction chamber, the chamber having a plurality of cooled inlets arranged so that, in use, the inlets are distributed across the substrate and have a constant separation from the substrate,
supplying a flow comprising a precursor compound through the inlets and into the reaction chamber to thereby decompose the precursor compound and form the graphene layer structure on the surface,
wherein the inlets are cooled to less than 100° C. and the susceptor is heated to a temperature of at least 50° C. in excess of a decomposition temperature of the precursor.

16. The method according to claim 1, wherein the dielectric layer is formed on the entirety of the first portion of the graphene layer structure which is disposed on the semiconducting region.

* * * * *